(12) United States Patent
Bandyopadhyay

(10) Patent No.: US 10,141,846 B2
(45) Date of Patent: Nov. 27, 2018

(54) METHODS AND APPARATUS FOR ADAPTIVE TIMING FOR ZERO VOLTAGE TRANSITION POWER CONVERTERS

(71) Applicant: Texas Instruments Incorporated, Dallas, TX (US)

(72) Inventor: Saurav Bandyopadhyay, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/396,471

(22) Filed: Dec. 31, 2016

(65) Prior Publication Data

US 2017/0302149 A1 Oct. 19, 2017

Related U.S. Application Data

(60) Provisional application No. 62/323,101, filed on Apr. 15, 2016.

(51) Int. Cl.
*H02M 3/158* (2006.01)

(52) U.S. Cl.
CPC .................................. *H02M 3/158* (2013.01)

(58) Field of Classification Search
USPC ................. 323/222, 223, 224, 271, 282–285
See application file for complete search history.

(56) References Cited

U.S. PATENT DOCUMENTS

| | | | |
|---|---|---|---|
| 5,594,635 A | 1/1997 | Gegner | |
| 5,684,688 A | 11/1997 | Rouaud et al. | |
| 5,736,842 A * | 4/1998 | Jovanovic | H02M 1/34 323/222 |
| 5,793,190 A * | 8/1998 | Sahlstrom | H02M 1/34 323/222 |
| 6,462,963 B1 | 10/2002 | Wittenbreder | |
| 7,145,316 B1 | 12/2006 | Galinski, III | |

(Continued)

FOREIGN PATENT DOCUMENTS

| | | |
|---|---|---|
| CN | 104201884 | 10/2014 |
| JP | H07123707 | 12/1994 |

OTHER PUBLICATIONS

International Search Report from corresponding PCT Application No. PCT/US2017/027452, dated Aug. 24, 2017 (2 pages).

(Continued)

*Primary Examiner* — Nguyen Tran
(74) *Attorney, Agent, or Firm* — Michael A. Davis, Jr.; Charles A. Brill; Frank D. Cimino

(57) ABSTRACT

A method of controlling a power converter, including executing a plurality of cycles, including: turning on a first switch during a first period, the first switch coupled to a power supply and a switch node; turning on a second switch during a second period, the second switch coupled to the switch node; turning on a third switch at a first time during the second period and turning the third switch off at a second time after the second period by a first open signal including a high discharge signal followed by a lower discharge signal, the third switch coupled to an auxiliary node and to a second inductor coupled to the auxiliary node; and turning on a fourth switch at a third time after the second time and turning the fourth switch off during the first period of a succeeding cycle, the fourth switch coupled to the auxiliary node.

19 Claims, 8 Drawing Sheets

(56) References Cited

U.S. PATENT DOCUMENTS

| | | | |
|---|---|---|---|
| 7,940,033 | B2 | 5/2011 | Dowlatabadi |
| 8,259,421 | B2 | 9/2012 | Nakahashi et al. |
| 9,172,299 | B2 | 10/2015 | Hamza et al. |
| 9,350,240 | B2 | 5/2016 | Dong et al. |
| 9,673,706 | B2 | 6/2017 | Matsuki |
| 2004/0136209 | A1 | 7/2004 | Hosokawa et al. |
| 2008/0068867 | A1 | 3/2008 | Yamada |
| 2008/0278128 | A1 | 11/2008 | Nagase |
| 2009/0027027 | A1 | 1/2009 | Lin et al. |
| 2009/0134855 | A1 | 5/2009 | Landwehr |
| 2009/0140706 | A1 | 6/2009 | Taufik et al. |
| 2009/0237042 | A1 | 9/2009 | Glovinski |
| 2010/0061122 | A1 | 3/2010 | Okubo et al. |
| 2010/0164593 | A1 | 7/2010 | Ha et al. |
| 2010/0327834 | A1 | 12/2010 | Lowe, Jr. |
| 2011/0149610 | A1 | 6/2011 | Moussaoui et al. |
| 2012/0099232 | A1 | 4/2012 | Kuroyabu et al. |
| 2012/0218785 | A1 | 8/2012 | Li et al. |
| 2012/0274294 | A1 | 11/2012 | Lee et al. |
| 2013/0093403 | A1 | 4/2013 | Jia et al. |
| 2013/0235631 | A1 | 9/2013 | Pahlevaninezhad et al. |
| 2013/0249520 | A1 | 9/2013 | Oikarinen et al. |
| 2014/0104952 | A1* | 4/2014 | Takeuchi ............... G11C 16/06 365/185.17 |
| 2014/0152271 | A1 | 6/2014 | Jeong et al. |
| 2014/0177300 | A1 | 6/2014 | Lagroce et al. |
| 2014/0232359 | A1 | 8/2014 | Dash et al. |
| 2014/0266130 | A1 | 9/2014 | Chiang et al. |
| 2015/0002115 | A1 | 1/2015 | Shenoy et al. |
| 2015/0022170 | A1 | 1/2015 | Chen |
| 2015/0162815 | A1 | 6/2015 | Mikami et al. |
| 2015/0326123 | A1 | 11/2015 | Fukushima et al. |
| 2016/0065071 | A1 | 3/2016 | Matsuki et al. |
| 2016/0365790 | A1 | 12/2016 | Ye et al. |
| 2017/0019093 | A1 | 1/2017 | Kanda et al. |
| 2017/0063227 | A1 | 3/2017 | Nakamura |
| 2017/0154739 | A1 | 6/2017 | Sugahara et al. |

OTHER PUBLICATIONS

Asad Abidi et al., "Understanding the Regenerative Comparator Circuit" Electrical Engineering Department, University of California, Los Angeles, 2014 IEEE, 8 pgs.

Behzad Razavi, "The StrongARM Latch", A Circuit for All Seasons, IEEE Solid-State Circuits Magazine, Spring 2015, pp. 12-17.

http://escholarship.org/us/item/6st6k2nz, 2.5.4 Comparator Design, pp. 27-28, 2013.

Jing Xue, Ho Lee, "A 2MHz 12-to-100V 90%-Efficiency Self-Balancing ZVS Three-Level DC-DC Regulator with Constant-Frequency AOT V2 Control and 5ns ZVS Turn-On Delay", ISSCC 2016 / Session 12 / Efficient Power Conversion / 12.5, 2016 IEEE International Solid-State Circuits Conference, Digest of Technical Papers, pp. 226-228.

International Search Report from corresponding PCT Application No. PCT/US2016/069149, dated May 25, 2017 (2 pages).

G. Hua, C.-S. Leu, Y. Jiang, and F. C. Lee, "Novel Zero-Voltage-Transition PWM Converters," IEEE Trans. Power Electron., vol. 9, No. 2, pp. 213-219, Mar. 1994, The Institute of Electrical and Electronics Engineers, Inc., 3 Park Avenue, 17th Floor, New York, N.Y. 10016-5997, U.S.A.

* cited by examiner

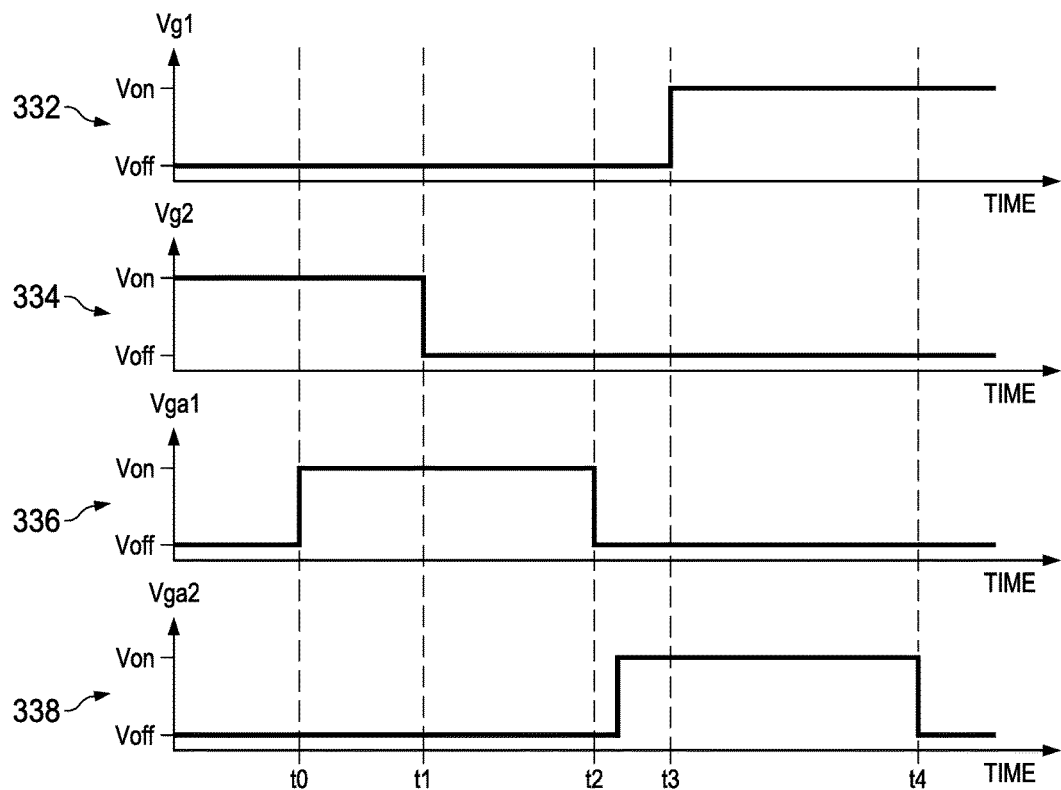
FIG. 3
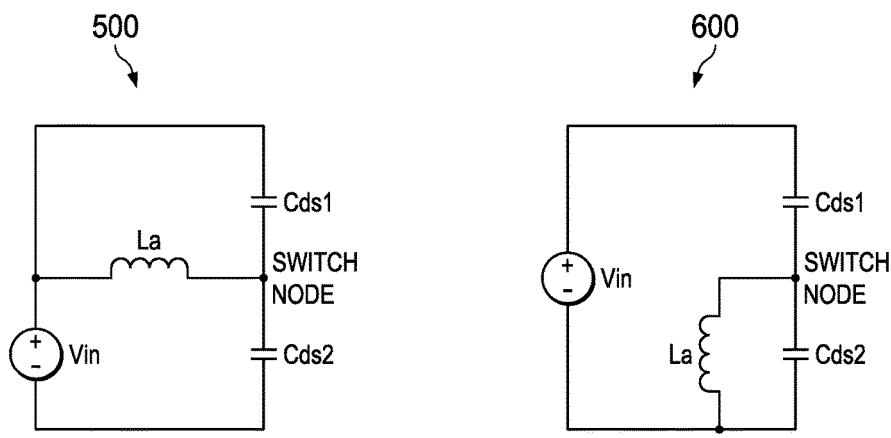
FIG. 5
FIG. 6

METHODS AND APPARATUS FOR ADAPTIVE TIMING FOR ZERO VOLTAGE TRANSITION POWER CONVERTERS

CROSS-REFERENCE TO RELATED APPLICATIONS

This application claims the benefit of priority under 35 U.S.C. § 119(e) to co-owned U.S. Provisional Patent Application Ser. No. 62/323,101, filed Apr. 15, 2016, entitled "Multi-Stage High-Side FET Drivers for ZVT Power Converters," naming Bandyopadhyay as inventor, which is hereby incorporated by reference in its entirety herein. In addition, this application is related to co-owned and co-assigned U.S. patent application Ser. No. 14/982,750 ("the '750 Application") entitled "Methods and Apparatus for Resonant Energy Minimization in Zero Voltage Transition Power Converters" naming LaBella et al. as inventors, and to co-owned and co-assigned U.S. patent application Ser. No. 15/350,697, filed Nov. 12, 2016, entitled "Methods and Apparatus for Adaptive Timing for Zero Voltage Transition Power Converters" naming LaBella et al. as inventors, and to co-owned and co-assigned U.S. patent application Ser. No. 15/396,466, entitled "METHODS AND APPARATUS FOR ADAPTIVE TIMING FOR ZERO VOLTAGE TRANSITION POWER CONVERTERS," filed Dec. 31, 2016, naming Bandyopadhyay et. al. as inventors, which applications are also hereby incorporated by reference in their entirety herein.

TECHNICAL FIELD

This relates generally to electronics, and, in particular, to circuits for power conversion.

BACKGROUND

A category of power supplies known as switching power supplies date back several decades and are currently heavily utilized in the electronics industry. Switching power supplies are commonly found in many types of electronic equipment such as industrial machinery, automotive electronics, computers and servers, mobile consumer electronics (mobile phones, tablets, etc.), battery chargers for mobile electronics, and low cost/light weight items such as wireless headsets and key chain flashlights. Many applications include switching power supplies for portable, battery powered devices where an initial voltage is stepped down to a reduced voltage for supplying part of the device, such as integrated circuits that operate at fairly low voltage direct current (DC) levels. Switching supplies are popular because these power supplies can be lightweight and are low cost. Switching supplies are highly efficient in the conversion of the voltage and current levels of electric power when compared to the prior approaches using non-switching power supplies, such as linear power supplies.

High efficiency is achieved in switching power supplies by using high speed, low loss switches such as MOSFET transistors to transfer energy from the input power source (a battery, for example) to the electronic equipment being powered (the load) only when needed, so as to maintain the voltage and current levels required by the load.

Switching power supplies that perform conversion from a DC input (such as a battery) that supplies electric energy within a specific voltage and current range to a different DC voltage and current range are known as "DC-DC" converters. Many modern DC-DC converters are able to achieve efficiencies near or above 90% by employing zero voltage transition (ZVT). The ZVT technique was developed by Hua, et. al. and is described in a paper published in 1994 ("Novel Zero-Voltage-Transition PWM Converters," G. Hua, C.-S. Leu, Y. Jiang, and F. C. Lee, IEEE Trans. Power Electron., Vol. 9, No. 2, pp. 213-219, March 1994), which is incorporated by reference in its entirety herein. The use of the ZVT function in DC-DC converters reduces energy loss that would otherwise occur due to switching losses. ZVT also has the additional benefit of reducing voltage stress on primary power switches of the DC-DC converters. Reduction in voltage stress on a switch allows the switch to have a lower voltage tolerance rating and, therefore, potentially the switch can be smaller and less costly.

The ZVT circuitry employed by prior DC-DC converters introduces additional switches and corresponding additional energy loss and voltage stress on switching elements. However, the impact of energy loss and voltage stress of the ZVT function is much less significant than the overall performance improvements to the switching converters that employ ZVT functionality. Further improvements to reduce energy loss and voltage stress of the ZVT function are still needed. These improvements will permit improvement of electronic equipment in increased battery life, lower cost of operation, and improved thermal management.

SUMMARY

In a described example, a method of controlling a power converter includes executing a plurality of cycles, including: turning on a first switch during a first period, the first switch coupled to a power supply and a switch node; turning on a second switch during a second period, the second switch coupled to the switch node; turning on a third switch at a first time during the second period and turning the third switch off at a second time after the second period by a first open signal including a high discharge signal followed by a lower discharge signal, the third switch coupled to an auxiliary node and to a second inductor coupled to the auxiliary node; and turning on a fourth switch at a third time after the second time and turning the fourth switch off during the first period of a succeeding cycle, the fourth switch coupled to the auxiliary node.

BRIEF DESCRIPTION OF THE DRAWINGS

FIG. 3 is a timing diagram of the sequence of switch transition events to operate ZVT functionality for an example arrangement of the present application.

FIG. 5 is a circuit diagram of an ideal equivalent circuit diagram of the ZVT resonant circuit.

FIG. 6 is a circuit diagram of an ideal equivalent circuit diagram of the ZVT resonant circuit in an alternative arrangement.

DETAILED DESCRIPTION OF THE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
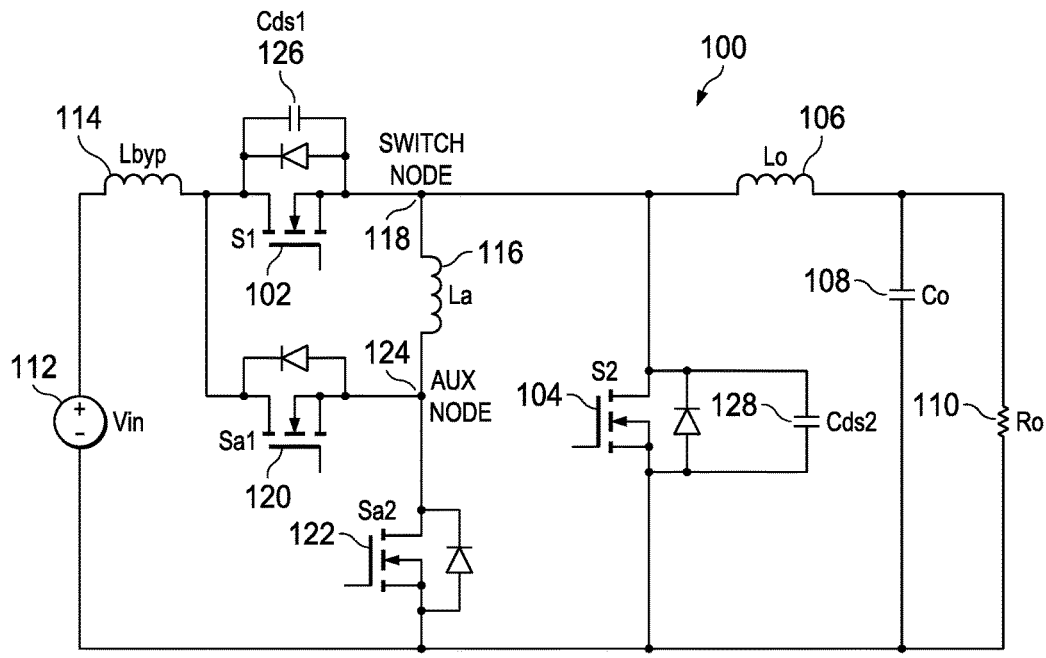
FIG. 1 is a circuit diagram illustrating a ZVT DC-DC buck power converter.

To better illustrate the shortcomings of the prior ZVT approaches, circuit 100 of FIG. 1 illustrates a ZVT DC-DC converter arranged in a buck converter circuit topology. Buck DC-DC converters provide an output voltage at a lower voltage than an input voltage. Other types of DC-DC converters that can benefit from the use of ZVT switching include, but are not limited to, boost converters that increase voltage to the load to a voltage greater than the input voltage, and buck-boost DC-DC converters that dynamically transition between the buck and boost functions to adapt to various input voltage levels (having input voltages that could be either greater or less than the output voltage) to provide an output voltage to the load.

FIG. 1 is a simplified circuit diagram of the switching elements, key passive components, and key parasitic elements of a ZVT DC-DC buck converter circuit 100. Omitted from FIG. 1 for simplicity of explanation are minor components, minor parasitic elements, the circuits for monitoring output voltage, and the control circuit for controlling the switch timing that are utilized in example ZVT DC-DC buck power converters.

In FIG. 1 circuit 100 includes two primary power switches, 102 (S1) and 104 (S2), that in conjunction with the output inductor 106 (Lo) and capacitor 108 (Co) perform the primary function of the buck converter. The buck converter circuit 100 supplies energy to the load (represented as a resistor 110 (Ro)) at an output voltage level Vo that is a reduced voltage from the DC input voltage supply 112 (Vin). Vin represents both the external element that is the source of input voltage (such as a battery or another power supply) to the ZVT power converter and the voltage level across the positive and negative terminals of the Vin input voltage source.

Auxiliary switches Sa1 and Sa2 and auxiliary inductor La are the components that are added to the conventional switching converter topology to accomplish the ZVT functionality. A primary parasitic inductance that contributes to voltage stress on switch S2 is represented in FIG. 1 by parasitic inductance 114 (Lbyp). The source terminal of transistor 102, the drain terminal of transistor 104 and one terminal of each auxiliary inductor 116 (La) and the output inductor 106 (Lo) are coupled as illustrated in FIG. 1 to a common switch node 118 (Switch Node). The first auxiliary switch 120 (Sa1), the second auxiliary switch 122 (Sa2), and the auxiliary inductor 116 are coupled together at auxiliary node 124 (Aux Node). All four switches in example circuit 100 of FIG. 1 (S1, S2, Sa1, and Sa2) are shown implemented as enhancement mode n-channel MOSFETs. Drain-to-source parasitic capacitances of switches S1 and S2 are important to the circuit description and are illustrated in FIG. 1 as capacitance 126 (Cds1) and capacitance 128 (Cds2), respectively. The intrinsic body diode of MOSFET switches is also shown coupled between source and drain for all switches (S1, S2, Sa1, and Sa2) of FIG. 1.

While enhancement mode n-channel MOSFETs are commonly used as switches in DC-DC converters as shown in the example in FIG. 1, other types of transistor switches as well as diode switches have been employed and can be used to form the circuit 100. The switches in FIG. 1 can also be used to form other types of switching power converters.

Circuit 100 supplies a reduced voltage to the load (the output voltage (Vo) is across resistor 110 (Ro)) by alternately switching between two primary states. In one of the primary states (defined by switch S1 closed and switch S2 open, which means switch S1 is a transistor that is turned on, while switch S2 is a transistor that is turned off), the input voltage source (Vin) supplies energy to the load, and also energy to maintain or increase magnetic energy is also stored in inductor Lo. In the other primary state (defined by switch S1 open and switch S2 closed, which means that switch S1 is a transistor that is turned off, while switch S2 is a transistor that is turned on), current flow from the input voltage (Vin) is blocked. In this state, the magnetic energy previously stored in inductor Lo is converted to electric energy, and supplies energy to the load (resistor Ro) at the output terminal. The output voltage Vo across the load Ro is maintained in a pre-defined range by varying the relative amount of time the circuit spends in each of the primary states.

Converters that alternate between the two states described hereinabove are sometimes described as pulse width modulated (PWM) switching converters. This description is used because the output voltage Vo is proportional to the input voltage Vin, multiplied by the duty cycle of switch S1 (a ratio of the on time of switch S1 to the total cycle period). Typically, prior known buck converters cycle between these states (often at frequencies such as hundreds of kHz to 1 MHz and above). In addition to the two primary states, there are brief dead times during the transitions between the two primary states. During the dead times, switches S1 and S2 are simultaneously open, that is the transistors implementing switches S1 and S2 are simultaneously turned off. Dead times are used to insure there is not a high current path across the input voltage source (Vin) directly to ground, which could occur if both switches S1 and S2 are simultaneously closed. Conventional PWM switching power supplies employ two dead times during each cycle of operation: a first dead time occurs when switch S1 opens and ends when switch S2 closes; and a second dead time occurs when switch S2 opens and ends when switch S1 closes.

In a ZVT converter, such as circuit 100, the ZVT function begins prior to the beginning of the second dead time with S2 opening, and the ZVT function ends after the second dead time ends with switch S1 closing. The ZVT function does not operate in the first dead time of the buck converter cycle described above (the time between switch S1 opening and S2 closing).

Figure 2:
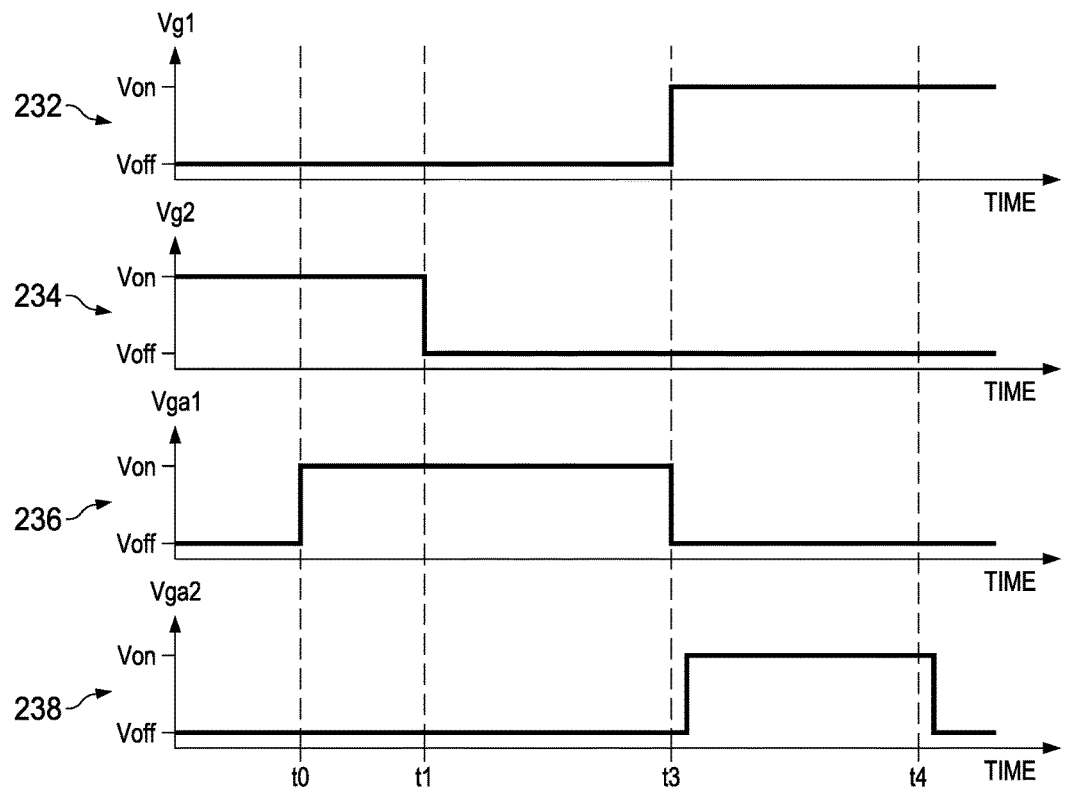
FIG. 2 is a timing diagram for a sequence of switch transition events to operate ZVT functionality.

FIG. 2 illustrates in a timing diagram the sequence of switch transition events used to operate ZVT functionality in the buck converter circuit 100. In FIG. 2, the switching events are labeled t0, t1, t3, and t4. (Note that there is no event labeled t2 in FIG. 2, for increasing simplicity of explanation when comparing the switching event sequence of the conventional ZVT DC-DC buck converters with the switching event sequences of example embodiments.) In FIG. 2, the dead time described hereinabove during the time interval between switch S2 opening and switch S1 closing begins at event t1 and ends at event t3.

The open and closed states of each of the four switches (primary S1, S2, and auxiliary switches Sa1, and Sa2) illustrated in FIG. 1 are represented in FIG. 2 by the voltage applied to the switch gates (Vg1, Vg2, Vga1, and Vga2, respectively) and shown in four graphs: 232, 234, 236, and 238. Graph 232 illustrates the voltage on the gate of switch S1, graph 234 illustrates the voltage on the gate of switch S2, graph 236 illustrates the voltage on the gate of switch Sa1, and graph 238 illustrates the voltage on the gate of switch Sa2. A voltage annotated as Von applied to a switch gate indicates the switch is closed (the corresponding transistor is on), and a voltage annotated as Voff indicates the switch is open (the corresponding transistor is off). FIG. 2 illustrates a sequence of switching events, and does not illustrate specific voltage levels, waveform shapes, and time increments.

ZVT functionality for prior known approaches begins at event labeled t0 in FIG. 2 with switch Sa1 turning on, as shown in graph 236. In the time leading up to event t0 switch S2 has been closed, and switches S1 and Sa2 have been open for a significant portion of the current buck converter cycle. Time progresses from event t0 to event t1 illustrated in FIG. 2. At time t1, switch S2 opens as shown in graph 234. At the next event, t3, switches S1 and Sa2 close as shown in both graphs 232, 238. Switch Sa1 opens at time t3, as shown in graph 236, and after a short delay to provide a dead time, Sa2 closes just after event t3, as shown in graph 238. At event t4, Sa2 opens as shown in graph 238 to complete ZVT functionality for the current cycle of the buck converter.

The example conventional ZVT buck converter circuit 100 illustrated in FIG. 1 accomplishes ZVT when the primary power switch S1 transitions from open to closed (S1 turn on as shown in graph 232) at event labeled t3 illustrated in FIG. 2. Switch S1 turns on at t3 with zero or near zero volts across it. For the circuit 100 to reach a condition with zero or near zero volts across switch S1 prior to S1 turning on (or closing), an L-C resonant circuit is used. The L-C resonant circuit increases the voltage at the source terminal of switch S1 (coupled to the node "Switch Node" in FIG. 1) until the voltage is approximately equivalent to the voltage at the drain terminal of S1, which is coupled to and approximately equivalent to the input voltage, Vin. The L-C resonant circuit includes the auxiliary inductor La and the parallel combination of capacitances Cds1 and Cds2 (the drain to source parasitic capacitances of the switches S1 and S2 respectively, see FIG. 1). This L-C resonant circuit is referenced herein as the "ZVT resonant circuit." The ZVT resonant circuit is a portion of circuit 100. In some approaches, the ZVT resonant circuit resonates only when switch Sa1 is closed and switches S1, S2, and Sa2 are open, which is during the time span between events t1 and t3 in FIG. 2. The time span between events t1 and t3 for some approaches is equivalent to one-quarter cycle of the resonant frequency of the ZVT resonant circuit.

While some conventional DC-DC converters incorporating the ZVT function typically have lower energy loss and lower voltage stress on transistor switches when compared to DC-DC converters formed without the ZVT function, the ZVT function itself introduces additional energy loss and voltage stress.

There are two key contributors to energy loss of prior known ZVT functions that are reduced by use of the embodiments. First, energy is lost when auxiliary switch Sa1 turns off when conducting peak current as it transitions through the MOSFET linear region. The second key contribution to energy loss during the ZVT operation is the sum of conduction losses through the auxiliary switches Sa1, Sa2, the primary switch S1, and inductor La.

The most significant impact of voltage stress resulting from the ZVT function is on the voltage tolerance required for switch S2. Voltage stress on switch S2 impacts S2 transistor size and potential cost. The voltage stress on switch S2 is the result of switch Sa1 turning off with peak current flowing through it, causing a voltage spike across switch S2 induced by the parasitic inductance 114 (Lbyp in FIG. 1). In addition, there is a voltage spike across Sa1 when it turns off with current flowing through it, due to ringing with parasitic inductances. However, sizing Sa1 for higher voltage tolerance is not a significant impact to potential converter cost, since Sa1 is already a relatively small transistor (when compared to the primary power transistors, S1 and S2.)

As discussed above, FIG. 1 illustrates in a simplified circuit diagram the switching elements, key passive components, and key parasitic elements of a ZVT DC-DC buck power converter. For the purposes of simplification, minor components, minor parasitic elements, and the circuits for monitoring output voltage and controlling the switch timing that are present in prior approaches and example arrangements of the present application are omitted from FIG. 1. An embodiment includes the sequencing and timing of transitions for the switches depicted in circuit 100. Consequently, circuit 100 is used herein for explanation of the switching events of a ZVT DC-DC buck power converter as well as for the illustration of arrangements of the present application.

In example embodiments, the switch transition sequencing and timing employed results in improved power efficiency. Use of the arrangements of the embodiments also enables improved ZVT power converters with reduced semiconductor die area for switch implementation.

The switch transition sequencing and timing employed in the embodiments of the present application occurs during the operation of the ZVT function, and does not significantly impact the operation of circuit 100 during the remainder of the power supply cycle. Consequently, a description of the full power supply cycle is not included.

FIG. 3 illustrates in a timing diagram the sequence of switch transition events to operate ZVT functionality for an example arrangement of the '750 Application. Note that while the embodiments can be used in conjunction with a ZVT converter such as is described in the '750 Application, the embodiments are not so limited and can be used with other ZVT converter circuitry. Use of the embodiments increases efficiency and results in lower transistor costs in ZVT converters including, but not limited to, the illustrative examples that are discussed herein. In FIG. 3, the switching events are labeled t0, t1, t2, t3, and t4.

The open and closed states of each of the four switches (S1, S2, Sa1, and Sa2) illustrated in FIG. 1 are represented in FIG. 3 by the voltage applied to the switch gates (Vg1, Vg2, Vga1, and Vga2 respectively). Graph 332 illustrates the voltage Vg1 at the gate terminal of switch S1. Graph 334 illustrates the voltage Vg2 at the gate terminal of switch S2. Graph 336 illustrates the voltage at the gate terminal of the switch Sa1. Graph 338 illustrates the voltage at the gate terminal of switch Sa2. A voltage annotated as Von applied to a switch gate indicates that the switch is closed because a transistor is on, and a voltage annotated as Voff indicates the switch is open because a transistor is off. Graphs 332, 334, 336 and 338 in FIG. 3 illustrate the sequence of switching events. FIG. 3 does not illustrate specific voltage levels, waveform shapes, and time increments. For both the embodiments and for other ZVT approaches there is a brief dead time between switch Sa1 turn off and switch Sa2 turn on. This dead time is used to insure there is not a high current path across the input voltage source, Vin. The dead time between switch Sa1 turn off and switch Sa2 turn on does not significantly impact circuit 100 functionality. Consequently, switch Sa1 turn off, the intervening dead time, and switch Sa2 turn on are illustrated as occurring in a single event (at time t2) in FIG. 3 for further simplicity of explanation.

ZVT functionality for the example arrangements of the '750 Application begins with the event labeled t0 in FIG. 3, with switch Sa1 turning on, as shown in graph 336, while switch S2 remains closed (on) and switches S1 and Sa2 remain open. In FIG. 3, time progresses to event t1. At event t1, switch S2 opens as shown in graph 334. At the next event, t2, as shown in FIG. 3, switch Sa1 opens as illustrated in graph 336, and after a short delay that fulfills the dead time requirement, switch Sa2 closes as shown in graph 338. (In sharp contrast to the arrangements of the present application, in prior approaches, the ZVT circuits do not employ a switching event at time t2, as previously stated.) As shown in FIG. 3, at event t3 for the arrangements of the present application, switch S1 is closing as is illustrated in graph 332. At event t4, switch Sa2 opens as shown in graph 338 to complete ZVT functionality for the current cycle of the buck converter.

Additionally, the waveform and timing diagrams provided herein are not annotated with voltage and current values and time increments since specific values depend on a how a specific example arrangement is implemented. When waveforms are compared herein, the same relative voltage, current, and time scales are used.

For each successive span of time between the above stated switching events, a description of the ZVT functionality and the switch transition sequencing and timing employed by the arrangements of the present application within the respective time span follows, as well as a comparison of the present arrangement to prior approaches. In addition, a description of the circuit functionality to control the switch sequencing and timing of the arrangements of the present application is provided hereinbelow.

The first time span during the operation of the ZVT function is between events t0 and t1 as shown in FIG. 3. The ZVT function starts during each buck converter cycle at event t0. In the time leading up to t0, the ZVT function begins in a state with switch S1 open and switch S2 closed, and switches Sa1 and Sa2 are open. At event t0, switch Sa1 closes, allowing current to flow through the auxiliary inductor La, which ramps from zero amperes until the current flowing in inductor La is approximately equivalent to the current flowing through inductor Lo. Simultaneously, the current flowing in the closed switch S2 ramps to zero or near zero. The behavior of circuit 100 for both the arrangements of the embodiments and for the other ZVT approaches is similar for the time interval starting at event t0 and ending at event t1, except that the time at which event t1 occurs after event t0 is adjusted by the control circuit of the arrangements of the present application. The adjustments are further described hereinbelow.

The adjustment to the time at which event t1 occurs can be performed in order to modify the resonant trajectory of the ZVT resonant circuit, such that the switch node voltage will be equal or nearly equal to the input voltage, Vin, at event t3 (ZVT functionality for subsequent events is described below). Adjusting the resonant trajectory on an on-going basis allows the ZVT function to adapt to dynamic changes in the load and for other operating conditions. The adjustment to the time at which t1 (following the events at t0) occurs is accomplished in the arrangements indirectly by monitoring and adjusting the current Is2 flowing through switch S2 when it is turned off at event t1. To accomplish the adjustment of the S2 turn off current, the switch node voltage is measured at event t3. If the switch node voltage is equal to or greater than Vin at time t3, the target value (the current through S2 when S2 turned off, or IS2-off) for the S2 turn off current is incrementally reduced. If the switch node voltage is less than Vin at time t3, Is2-off is incrementally increased. During the operation of the ZVT function of the immediately following buck converter cycle, the current in switch S2 is monitored between events t0 and t1 and is compared to Is2-off (set in the previous cycle). In the arrangements, the switch S2 is turned off when the current Is2 is equal to or less than Is2-off.

The second time span during the operation of the ZVT function as shown in FIG. 3 is between events t1 and t2. For both the arrangements of the present application and for other ZVT approaches, switch S2 opens at event t1 with zero or near zero current flowing through it, as shown in graph 334. Switches S1 and Sa2 remain open at t1. With only switch Sa1 closed, the inductor La resonates with the parallel combination of the parasitic drain to source capacitances, Cds1 and Cds2, of switches S1 and S2, respectively (the ZVT resonant circuit). In example arrangements of the embodiments, event t2 occurs at a time that is ⅙ tr after event t1 (where "tr" is the resonant period of the ZVT resonant circuit). At ⅙ tr, the switch node reaches a voltage greater than ½ Vin. At time t2, Sa1 is opened and Sa2 is closed (after a short dead time delay between opening Sa1 and closing Sa2) as shown in FIG. 3 in graphs 336, 338.

Figure 4:
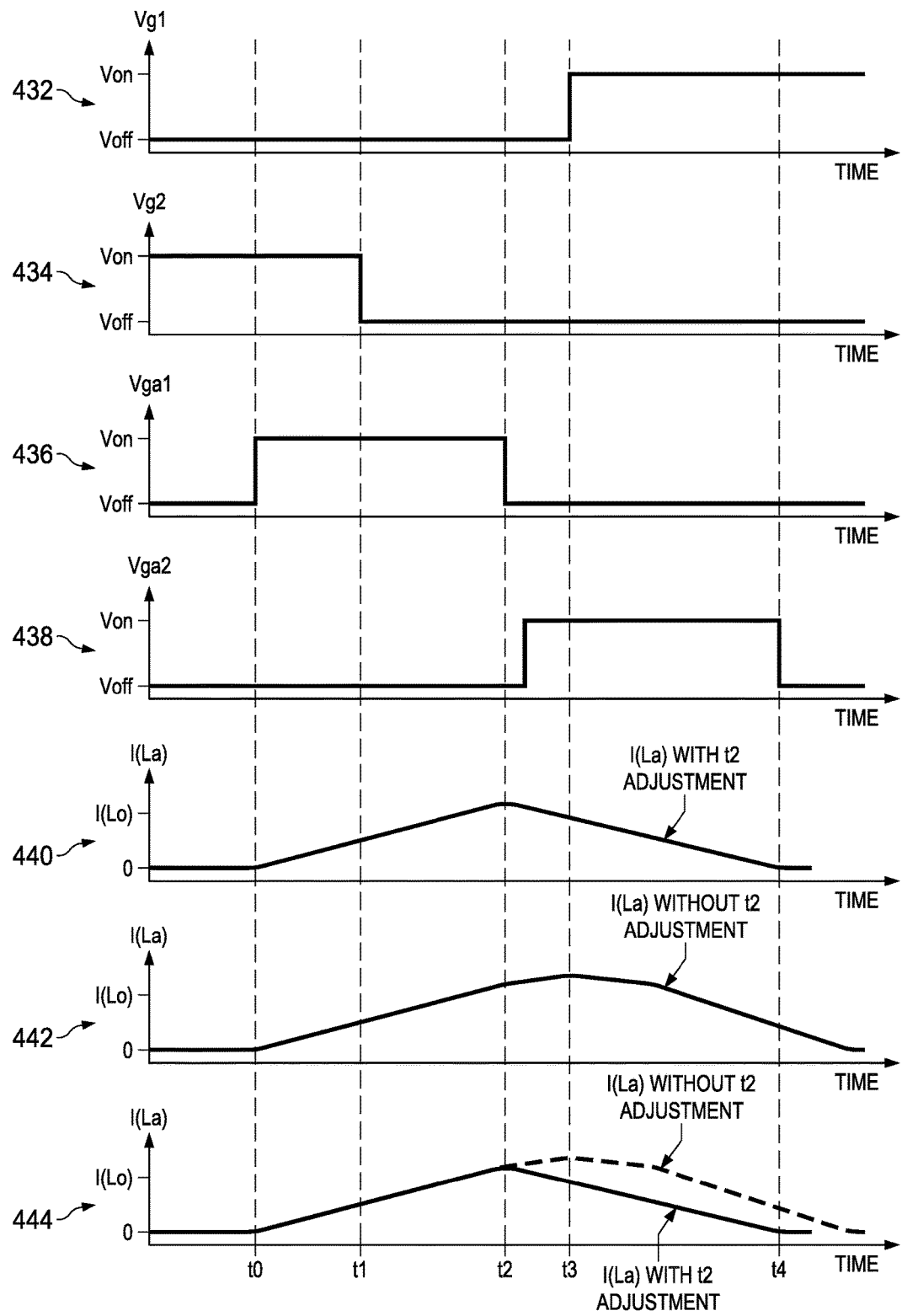
FIG. 4 is a group of waveform plots with the timing diagrams of FIG. 3.

FIG. 4 illustrates in graphs 440, 442 and 444 the current in auxiliary inductor 116 (La, FIG. 1), labeled I(La), for the example arrangements of the '750 Application and also presents graphs comparing the current obtained to the corresponding current obtained in other approaches for conventional ZVT converters. The switching events t0, t1, t2, t3, and t4 shown in FIG. 4 are duplicated from FIG. 3 in graphs 432, 434, 436 and 438, respectively, for clarity of illustration. The time scales of FIG. 4 for I(La) waveforms are the same for both the arrangements of the present application and the prior approaches illustrated for comparison.

Graphs 432, 434, 436, and 438 of FIG. 4 correspond to the graphs 332, 334, 336 and 338 in FIG. 3, respectively, and depict the gate voltages on the switches S1, S2, Sa1, and Sa2, respectively, for circuit 100 in FIG. 1. In FIG. 4 an example sequencing arrangement of the '750 Application is illustrated at the events t0, t1, t2, t3 and t4.

In FIG. 4, the current flowing in the inductor La (labeled 116 in FIG. 1) is shown on separate graphs 440 for I(La) with the event time t2 adjustment and 442 for I(La) without t2 adjustment, as well as graph 444 which combines both the arrangements on the same set of axes. Graph 444 is presented to illustrate that arrangements with t2 adjustment operate at lower inductor La current for a shorter time period during the time span between events t2 and t4. For the overlaid waveform diagram in graph 444, a dashed line is used to illustrate current I(La) without t2 adjustment to show where the waveforms differ significantly. In graphs 440, 442 and 444 of FIG. 4, the current through Lo is represented by fixed grid line labeled I(Lo). In practice, I(Lo) is not a fixed value and is load dependent. For simplicity of explanation, I(Lo) is shown as a fixed value.

An additional difference between approaches that do or do not adjust t2 is that in the arrangements where t2 is adjusted, a voltage spike occurs when switch Sa1 opens at event t2 with current flowing through it, due to ringing with parasitic inductances. In other ZVT buck converters where t2 and t3 coincide, this voltage spike appears only across switch S2, since it is open and switch S1 is closed when the spike occurs. In contrast, in the arrangements where t2 is adjusted, the arrangements operate by opening switch Sa1 with both S1 and S2 open and before the drain to source capacitance of S1 (Cds1) is fully discharged, distributing the voltage spike across both switches S1 and S2 in series. Specifically, in the approach where t2 is adjusted, the series combination of the parasitic drain-source capacitances Cds1 and Cds1 of switches S1 and S2 respectively form a capacitive divider across which the voltage spike occurs. Dividing the voltage spike across both S1 and S2 reduces the voltage tolerance requirement of switch S2 (when compared to the voltage tolerance requirement for the same switch in other approaches). The voltage tolerance requirement of the switch S1 is not increased with t2 adjustment, because the spike across S1 that occurs when Sa1 opens in the example arrangements is less than the voltage across S1 at other times during the operation of the buck converter. Reducing the voltage tolerance requirement of switch S2 allows the use of smaller, and cheaper, transistors to implement switch S2.

The third time span during the operation of the ZVT function for the approach with t2 adjustment is between events t2 and t3. As stated hereinabove in the description of FIG. 3, event t2 for the arrangements of the '750 Application occurs when the transition of switch Sa1 from closed to open occurs, and switch Sa2 transitions from open to closed shortly afterwards, with switches S1 and S2 remaining open. When switch Sa1 opens and switch Sa2 closes, the ZVT resonant circuit configuration is changed and the voltage across inductor La reverses. Current flow through inductor La will continue in the same direction, and resonance will continue on a different trajectory with the current in La resonating towards zero, resulting in the switch node continuing to charge. The energy stored in La at event t2 continues charging the switch node until it becomes approximately equivalent to the input voltage Vin, provided the event at time t2 occurs with the switch node voltage still sufficiently above ½ the Vin voltage level. It should be noted that for an ideal circuit, if t2 were to occur when the switch node is exactly ½ Vin, then the energy stored in inductor La will charge the switch node voltage to Vin. However, in the example arrangements, t2 should occur with the switch node at a voltage greater than ½ Vin so as to accommodate component parameter variance and non-ideal circuit characteristics. The switch node voltage becomes approximately equivalent to Vin at a time that is 1/12 tr after the event t2, at which time event t3 occurs, with S1 closing. This sequence is shown in graphs 432, 434, 436, and 438 at time t3.

FIG. 5 illustrates in a simplified circuit diagram an equivalent ideal ZVT resonant circuit 500 for the example configuration operating during the span of time from event t1 to t2 described hereinabove. FIG. 6 illustrates in another simplified circuit diagram the equivalent ideal ZVT resonant circuit 600 for the example configuration for the span of time from event t2 to t3 described hereinabove. Both equivalent circuits 500 and 600 illustrate a portion of circuit 100 of FIG. 1 with switches S1, S2, Sa1, and Sa2 in the states described hereinabove for the respective time spans. For simplicity, in the diagrams for circuits 500 and 600, the switches Sa1 and Sa2 are treated as ideal and shown as interconnect conductors when closed, and are simply not shown when open.

As described hereinabove, during the time period between events t2 and t3 for arrangements of the present application, stored energy in inductor La is used to charge the switch node from a level greater than ½ Vin to Vin. In sharp contrast to the present arrangements, for ZVT converters using other approaches, the converters utilize energy from the power converter input voltage source, Vin, to charge the switch node to be approximately equivalent to the input voltage, Vin. Consequently, more energy is stored in La and thus current is higher in La when switch S1 closes at t3 during operation of prior approaches (than for the arrangements of the present application). Greater stored energy in La and higher current through La result in greater energy losses for the other approaches.

As stated hereinabove, the event t2 of the present arrangements is not part of the operation of other approach converters. Therefore, other approach ZVT resonant circuits continue resonance on the same trajectory for the full time span from t1 to t3. In contrast, for the example arrangements herein described, the resonant trajectory is modified at event t2 as described hereinabove.

As illustrated in FIG. 4, compared to other approaches, current through switch Sa1 is lower when Sa1 turns off during operation of example arrangements of the '750 Application. The current through Sa1 is lower due to ramping the switch node voltage to a level greater than ½ Vin. The turn-off of switch Sa1 is performed early (when compared to the other approaches), as opposed to waiting for the switch node voltage to be approximately equivalent to Vin. As a result, energy lost by switch Sa1 while it is conducting in the transistor linear region (during the transition from on to off) is much lower for arrangements of the present application.

The fourth and final time span during the operation of the ZVT function is between events t3 and t4. During the period of time between events t3 and t4, switch S1 turns on at event t3, and the current in inductor La ramps down to zero, at which time Sa2 is turned off at event t4, ending the operation of the ZVT function for the current buck converter cycle. After switch S1 closes, the portion of the current in stored in inductor La that exceeds the current in Lo is returned to the source and the remainder of the current in La flows into Lo to supply the load.

There are at least three differences between the operations of other approaches and the operation of the arrangements of the '750 Application in the time period between events t3 and t4. The first difference is that switch Sa1 opens and switch Sa2 closes at t3 in other approaches. For the approaches of the '750 Application, Sa1 opens and Sa2 closes prior to the event t3 (at t2) as described hereinabove. The second difference is that a smaller fraction of the energy stored in inductor La is returned to the source (when compared to the other approaches), thus reducing energy losses. The third difference is that for the other approaches, the inductor La current reaches its peak at t3. Instead, for the approach of the '750 Application, the peak current through La is lower and the peak current is achieved earlier in time (at event t2), resulting in the time period from t3 to t4 being significantly shorter for the described arrangements. Additionally, the time from t2 to t4 for the described arrangements is shorter than the time from t3 to t4 for other approaches.

The operation of example arrangements of the '750 Application described hereinabove results in switches Sa1, Sa2, and S1 and inductor La each conducting current for shorter amounts of time (when compared to the other approaches) with lower RMS current levels, resulting in significantly lower energy loss. The benefits that can accrue by use of the arrangements include: RMS current through Sa1, Sa2, S1, and La are lowered, since Sa1 turns off prior to the switch node voltage reaching Vin, resulting in lower peak current in La, Sa1, and Sa2; conduction time for switch Sa1 is reduced, since it turns off earlier than in prior approaches, turning off prior to the switch node voltage reaching Vin; and, since the peak current in La is lower for the arrangements described hereinabove, the current in La ramps to zero in less time, resulting in lower RMS current in switch S1. In addition, since the current in La ramps to zero more rapidly, the conduction times for switch Sa2, switch S1, and inductor La are also reduced.

It should be noted that while the embodiments can be incorporated with and applied to the circuitry and methods of the '750 Application, the embodiments are not so limited and can be applied to and used in other ZVT converter arrangements. That is, while the examples herein discuss the circuitry and approaches of the '750 Application as an example ZVT circuit and methods, the embodiments can be used with other ZVT arrangements and will accrue advantages for those applications, as well. The embodiments and the scope of the appended claims are not to be limited to the illustrative examples described herein.

Figure 7:
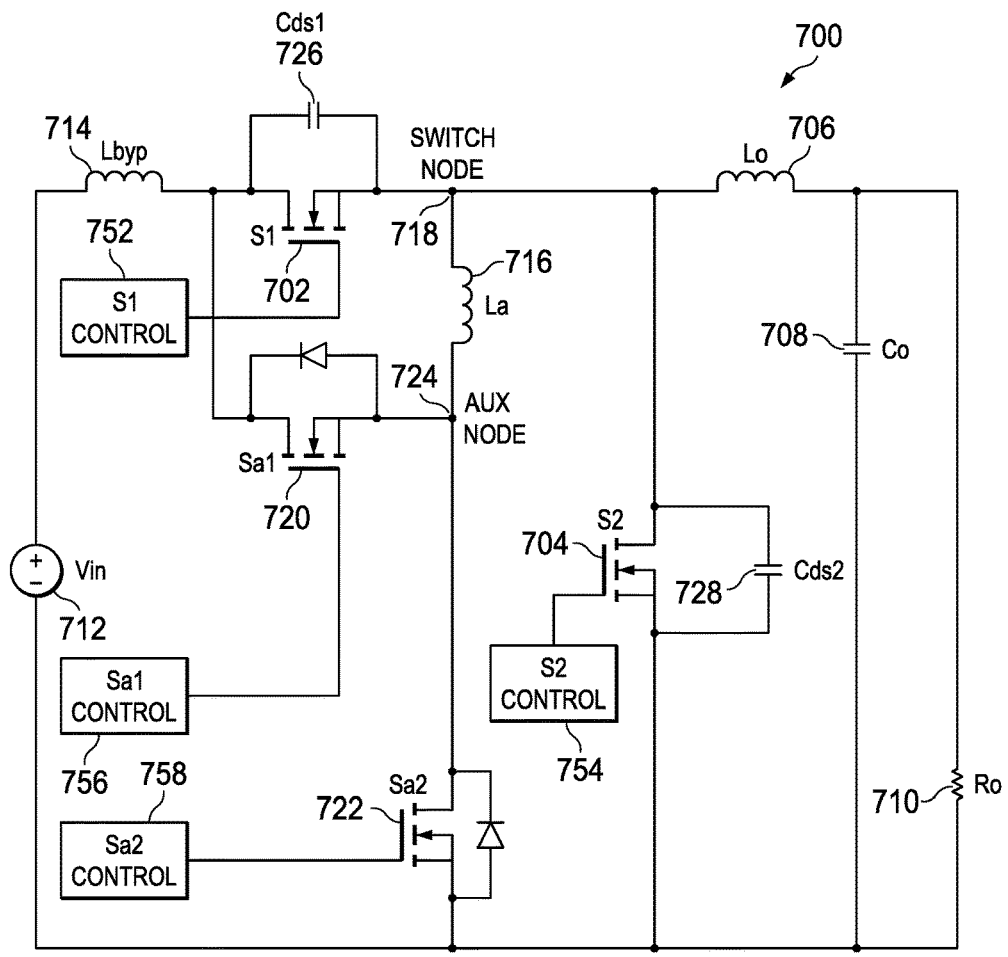
FIG. 7 is a simplified circuit diagram of an embodiment ZVT buck converter circuit.

FIG. 7 is a simplified circuit diagram of an embodiment for a ZVT buck converter circuit. Similarly labeled elements of FIG. 7 perform similar functions to those of FIG. 1. That is, elements 702, 704, 706, 708, 710, 712, 714, 716, 718, 720, 722, 724, 726, and 728 perform similar functions to elements 102, 104, 106, 108, 110, 112, 114, 116, 118, 120, 122, 124, 126, and 128, respectively, in FIG. 1. The timing of the operation of circuit 700 during the interval from when S2 turns off until S1 turns on is shown in FIG. 3. In FIG. 7, control 752 controls switch 702 (S1), control 754 controls switch 704 (S2), control 756 controls switch 720 (Sa1), and control 758 controls switch 722 (Sa2). The timing of the on/off signals applied by controls 752, 754, 756 and 758 control switches 702, 704, 720 and 722, respectively in accordance with the timing shown in FIG. 3.

In the circuit of FIG. 7, the switch 720 (Sa1) turns off with a current higher than the current through load resistance 710 because, at the time of turn off (t2, FIG. 3), switch 720 carries the load current plus the resonant current for ZVT operation. This indicates that a low drive current is needed to turn off switch 720 to limit the change in current (dI/dt), particularly in the Miller plateau and lower gate voltages, because a low dI/dt minimizes ringing across the switch during turn off due to the parasitic loop inductances and device capacitances. Single stage drivers with a controlled and sustained turn off current can reduce the ringing, but at the cost of increasing the effective pulse width of the gate signal of switch 720 and higher effective switch resistance especially for narrow pulse widths. The increased effective pulse width increases the circulating currents in the auxiliary half bridge and inductor. Along with a higher effective switch resistance, the implementation suffers from higher conduction losses.

Figure 8:
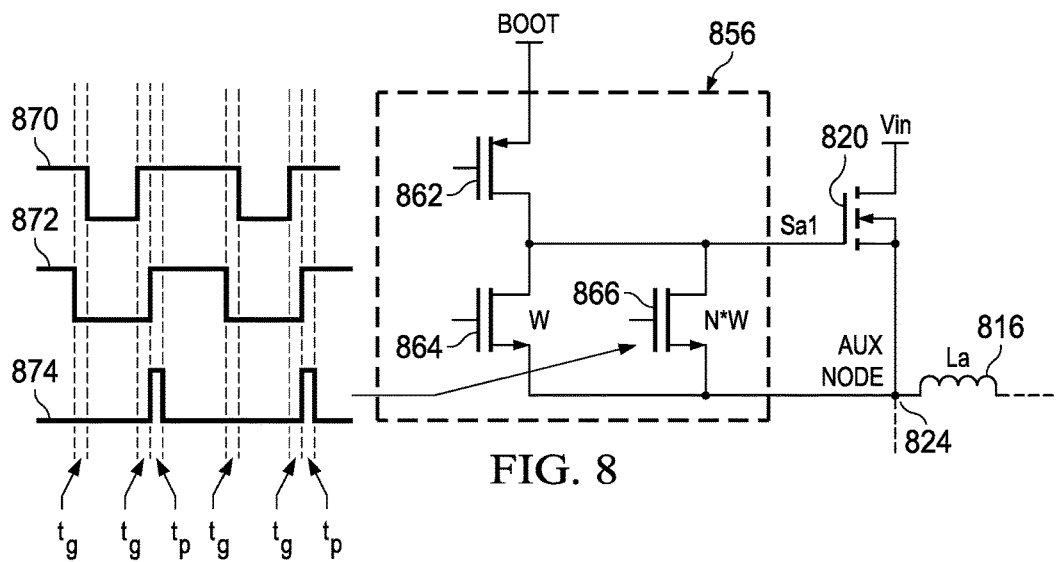
FIG. 8 is a simplified circuit diagram of an embodiment switch control.

FIG. 8 is a simplified circuit diagram of an embodiment for switch control. Similarly labeled elements of FIG. 8 perform similar functions to those of FIG. 7. That is, elements 816, 820, 824 and 856 perform similar functions to elements 716, 720, 724 and 756, respectively, in FIG. 7. Transistor 862 is a p-type transistor with its source coupled to a boosted node (i.e. higher than Vin) labeled "Boot." Transistor 862 is driven by signal 870. Because transistor 862 is p-type, transistor 862 is on when signal 870 is low. Transistor 864 is an n-type transistor coupled from the gate of switch 820 to the source of switch 820. Transistor 864 is driven by signal 872. Because transistor 864 is n-type, transistor 864 is on when signal 872 is high. As can be seen in FIG. 8, there is a gap $t_g$ from the time transistor 864 turns off to the time transistor 862 turns on. In addition, there is the gap $t_g$ between the time transistor 862 turns off and transistor 864 turns on. This is to ensure that transistors 862 and 864 are not on at the same time, thus preventing a conductive path from the Boot node to Aux Node 824. In addition to transistor 864, transistor 866 is also coupled from the gate of switch 820 to the source of switch 820. The channel width of transistor 866 (N*W) is several times the channel width of transistor 864 (W). Transistor 866 is controlled by signal 874. Transistor 866 is on for a period $t_p$ at the beginning of the time transistor 864 is on. Therefore, during time $t_p$, both transistors 864 and 866 are on, thus providing a very large pull down current to discharge the gate of switch 820.

The time period $t_p$ is selected to drive the gate voltage of transistor 820 quickly to the Miller plateau. After $t_p$ elapses, transistor 866 is off to provide a much lower turn off current, and thus a lower dI/dt through switch 820. Thus, control 856 provides quick turn off of switch 820 before the Miller plateau, combined with slower turn off during the Miller plateau, to reduce ringing. Control 856 performs better than constant current or constant impedance drives because it gives the advantages of even faster transition (before the Miller region) along with good damping (due to slow turn off after the onset of the Miller region) and keeps the switch 820 effective on-resistance low during turn off.

Figure 9:
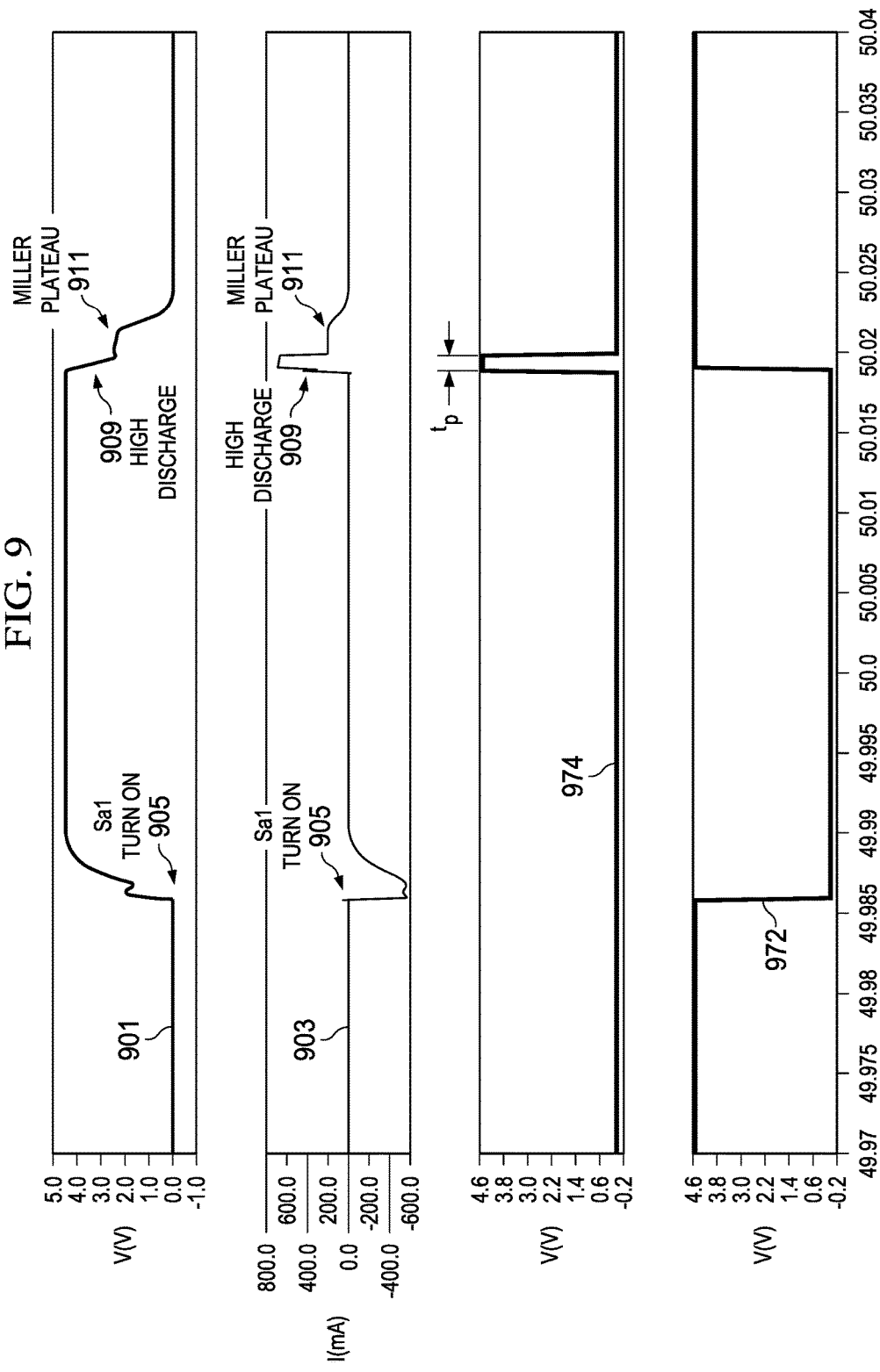
FIG. 9 is a graph showing a simulation of an embodiment such as that of FIG. 8.

FIG. 9 is a graph showing the results of a simulation of a circuit like the circuit of FIG. 8. Trace 901 is the voltage on the gate of switch 820 (FIG. 8). Trace 903 is the current charging or discharging the gate of switch 820 (FIG. 8). Trace 974 is the signal applied to transistor 866 (FIG. 8), which is similar to signal 874. Trace 972 is the signal applied to transistor 864 (FIG. 8), which is similar to signal 872. At point 905, the gate of switch 820 is charged to a high value by transistor 862 under the control of signal 870 (FIG. 8). At point 909, a high discharge current is applied to the gate of switch 820 (FIG. 8) because both transistors 864 and 866 (FIG. 8) are on because of signals 972 and 974, respectively. The duration $t_p$ of the on time for signal 974 is selected so that gate of switch 820 (FIG. 8) reaches the Miller plateau 911 quickly, but ends as the Miller plateau 911 begins. This provides a quick turn off of switch 820 (FIG. 8) with good damping of ringing due to the lower discharge level during the Miller plateau 911.

Figure 10:
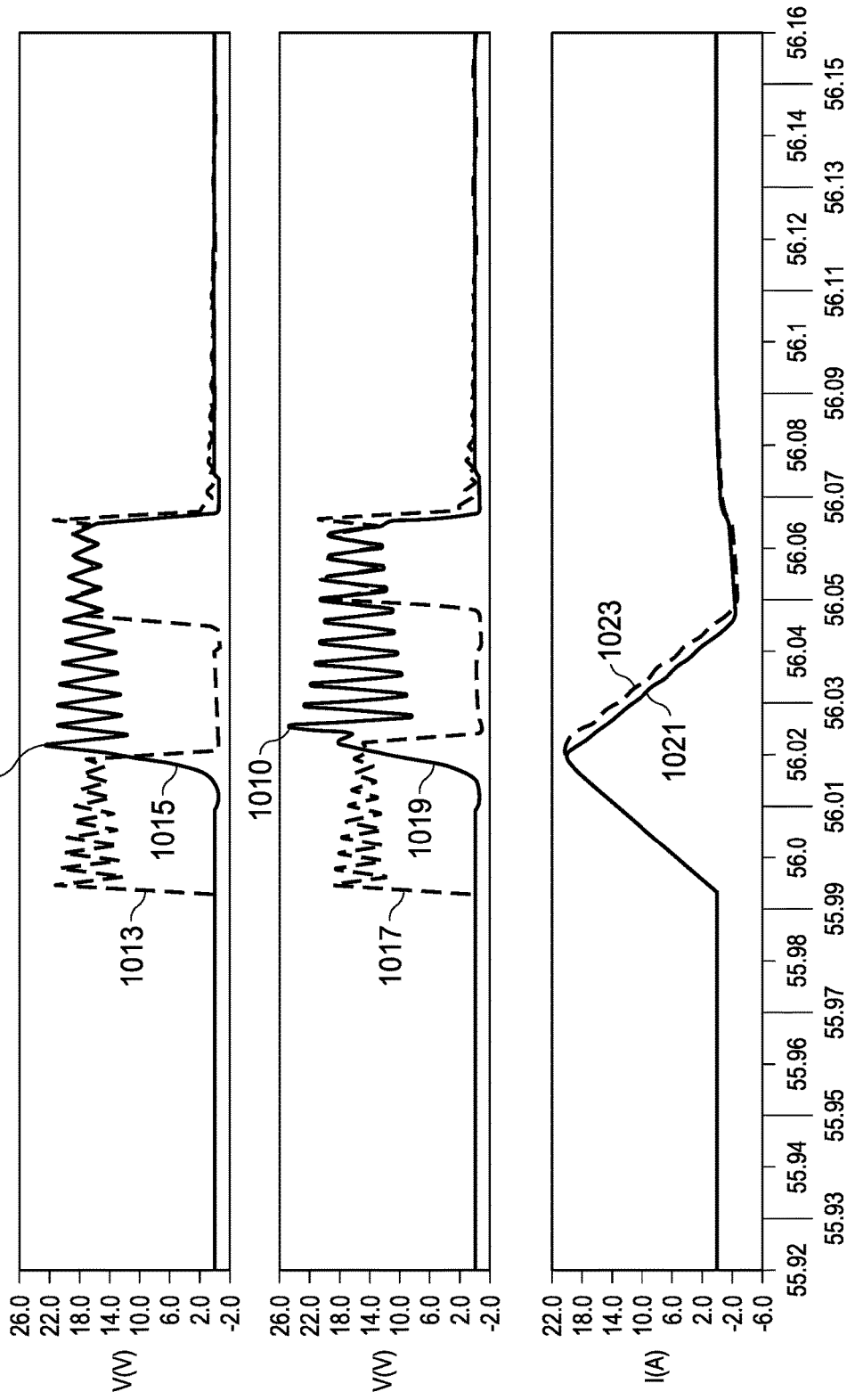
FIG. 10 is a graph of simulation results with and without the circuit of FIG. 8.

FIG. 10 is a graph showing simulation results with and without the circuit of FIG. 8. Trace 1013 is the voltage at auxiliary node 724 (FIG. 7) using control 856 (FIG. 8) to control switch 720 (FIG. 7). Trace 1015 is the voltage at switch node 718 (FIG. 7) using control 856 (FIG. 8) to control switch 720 (FIG. 7). In addition, trace 1021 is the current through auxiliary inductor 716 (FIG. 7) using control 856 (FIG. 8) to control switch 720 (FIG. 7).

In contrast, Trace 1017 is the voltage at auxiliary node 724 (FIG. 7) without using control 856 (FIG. 8) to control switch 720 (FIG. 7). Trace 1019 is the voltage at switch node 718 (FIG. 7) without using control 856 (FIG. 8) to control switch 720 (FIG. 7). Trace 1023 is the current through auxiliary inductor 716 (FIG. 7) without using control 856 (FIG. 8) to control switch 720 (FIG. 7). Comparison of trace 1015 at point 1009 to trace 1019 at point 1010 shows that the use of the embodiments including control 856 significantly reduces the ringing at switch node 718 (FIG. 7) while improving the ramp up speed of switch node 718 (FIG. 7). In addition, trace 1023 shows that the current through auxiliary inductor 716 (FIG. 7) is greater and more persistent than the current shown in trace 1021. This shows an RMS power savings using control 856 (FIG. 8) to control switch 720 (FIG. 7). While this data shows particular benefits of the use of control 856 (FIG. 8) to control switch 720 (FIG. 7), control 856 may also be used as controls 752, 754 and 758 (FIG. 7) to provide rapid turn off with good damping of ringing for switches 702, 704 and 722 (FIG. 7), respectively.

Figure 11:
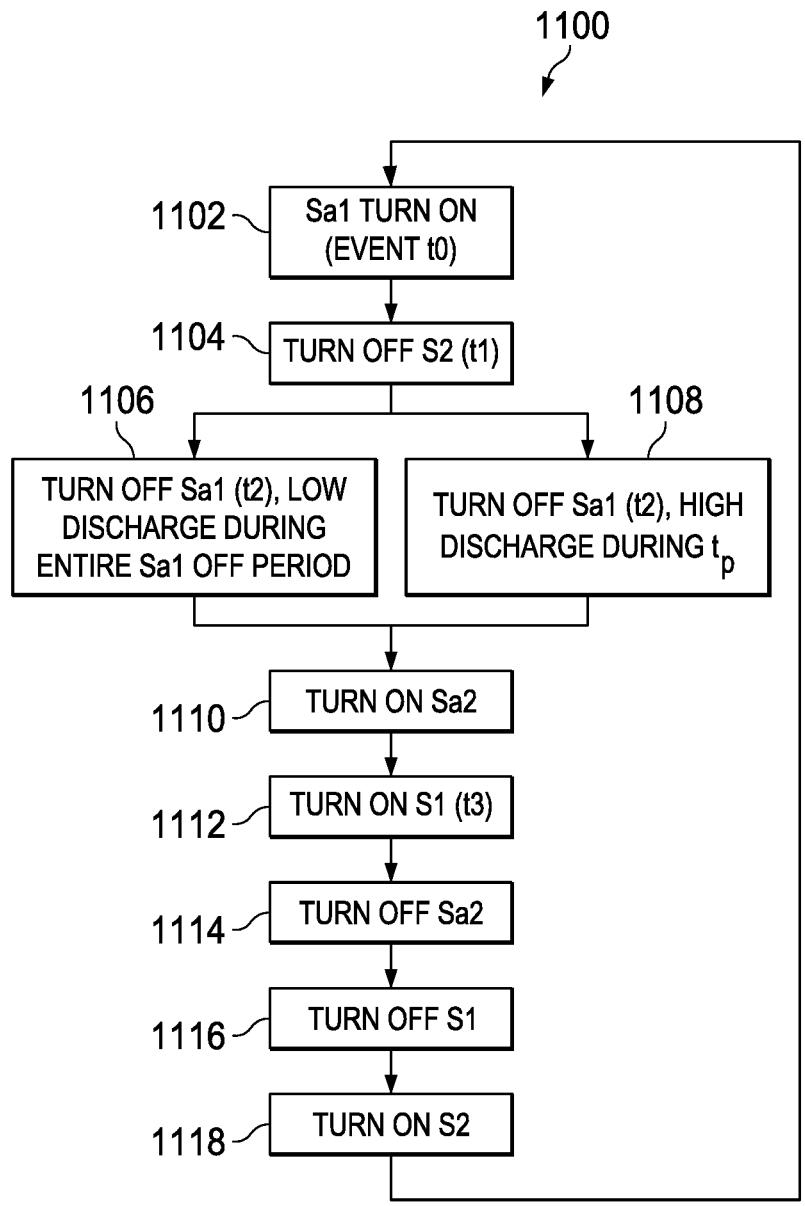
FIG. 11 is a flow diagram of a method embodiment.

FIG. 11 is a flow diagram of a method embodiment. Method 1100 begins with step 1102, which turns on Sa1 at event $t_0$. Step 1104 turns off S2 at t1. Step 1106 turns off Sa1 at t2 using the low discharge. At about the same time, step 1108 discharges Sa1 with a high discharge for $t_p$. Step 1110 turns on Sa2. Step 1112 turns on S1 at t3. Step 1114 turns off Sa2. Step 1116 turns off S1 and step 1118 turns on S2. Following these steps, the cycle repeats.

The method of FIG. 11 can be applied to the ZVT timing of the '750 Application. In addition, in alternative embodiments, the method of FIG. 11 can be applied to ZVT timing circuitry other than that of the '750 Application, and the embodiments and the appended claims are not limited to the illustrative examples described herein.

Figure 12:
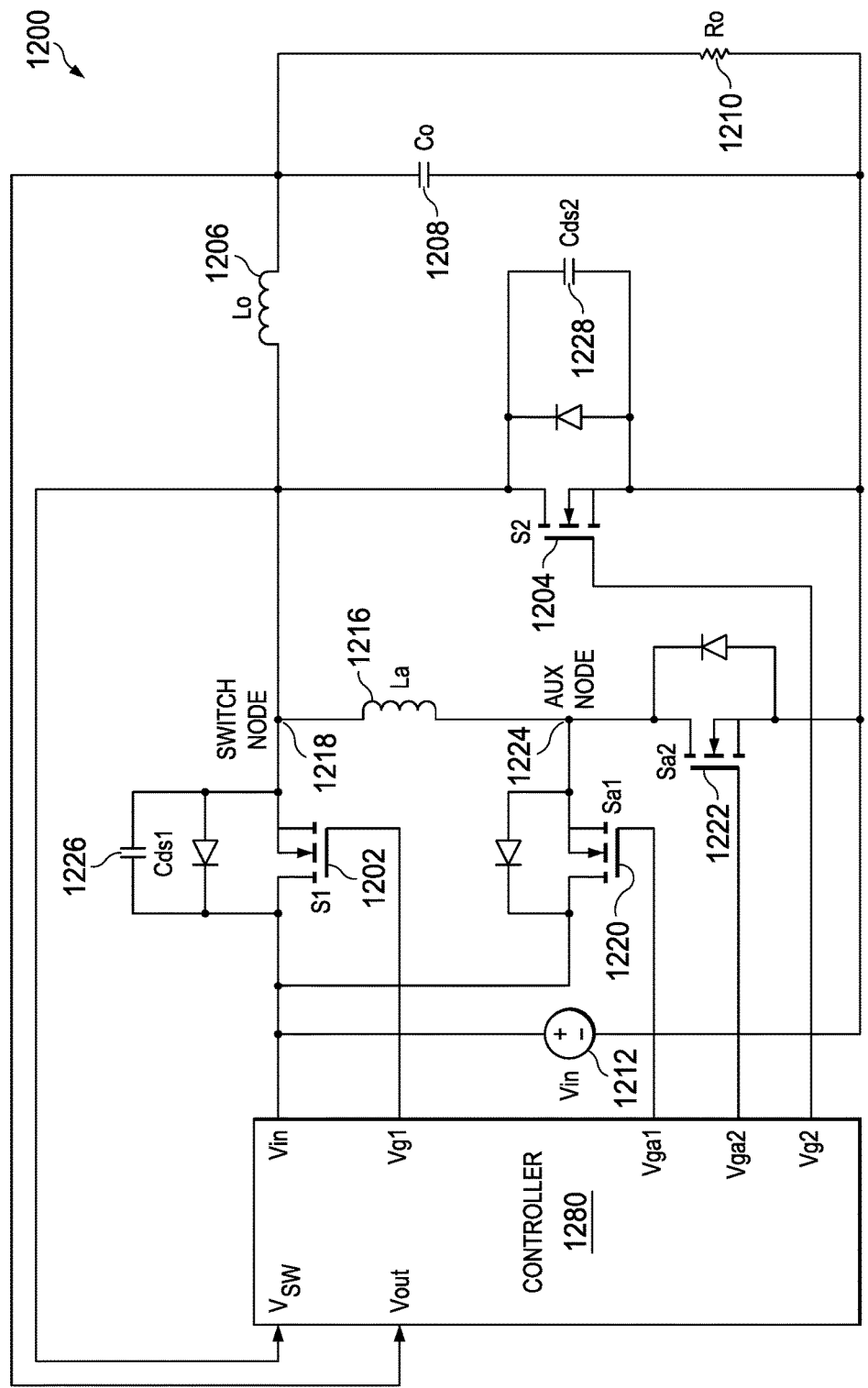
FIG. 12 is a circuit diagram of another circuit embodiment.

FIG. 12 is a circuit diagram of another embodiment circuit. Circuit 1200 includes a controller 1280 that provides a ZVT power converter in a buck circuit topology incorporating the embodiments. In an embodiment, controller 1280 can be formed as a monolithic integrated circuit or as a multichip package, which may or may not include other components shown in FIG. 12. Similarly labeled elements of FIG. 12 perform similar functions to those of FIG. 7. That is, elements 1202, 1204, 1206, 1208, 1210, 1212, 1216, 1218, 1220, 1222, 1224, 1226, and 1228 perform similar functions to elements 702, 704, 706, 708, 710, 712, 716, 718, 720, 722, 724, 726, and 728, respectively, in FIG. 7. In circuit 1200, the example buck converter of FIG. 1 is again shown, with an input voltage Vin, a pair of primary switches S1, S2, which with the output inductor Lo, capacitor Co, and resistance Ro, provide a voltage Vout to a load Ro coupled to the output. To provide the zero-voltage transition function for the converter, auxiliary switches Sa1 and Sa2, and inductor La, are used to control the voltage at the source terminal of switch S1 and to allow switch S1 to be turned on when the source-drain voltage of S1 is approximately zero.

In FIG. 12, controller 1280 provides the gate control voltages Vg1, Vg2 to the primary switches S1, S2 and also the gate control voltages Vga1, Vga2, to the auxiliary switches Sa1, Sa2. Among other functions, controller 1280 performs the functions of controls 752, 754, 756 and 758 of FIG. 7 described hereinabove. Controller 1280 implements the switching sequences to operate the buck converter of circuit 1200. Controller 1280 also controls the gate voltages for other portions of the converter operating cycle to regulate the output voltage. The inputs to controller 1280 include the input voltage, Vin, the output voltage, Vout, and the switch node voltage, $V_{sw}$.

Controller 1280 can be implemented in a variety of ways, for example as circuits including, as non-limiting examples, a microcontroller, microprocessor, CPU, DSP, or other programmable logic, as a dedicated logic function such as a state machine, and can include fixed or user programmable instructions. Further, as an alternative arrangement, controller 1280 can be implemented on a separate integrated circuit, with the switches S1, S2, Sa1, Sa2, and the remaining passive analog components, implemented on a stand-alone integrated circuit. In an alternative, one or more of switches S1, S2, Sa1, Sa2, and the remaining passive analog components may be implemented in the same substrate as controller 1280. Controller 1280 can be implemented as an application specific integrated circuit (ASIC), using field programmable gate arrays (FPGAs) or complex programmable logic devices (CPLDs) and the like. The sequencing and timing control of the arrangements described herein can be implemented as software, firmware or hardcoded instructions. Delay lines and counters and the like can be used to determine the delays ⅙ tr, 1/12 tr, as determined by a particular hardware designer. Because the arrangements herein are implemented as changes in the sequence of gate signals applied to the transistors of a converter, the arrangements can be utilized in existing converter circuits by the modification of software and some sensing hardware, and thus the arrangements can be used to improve the performance of prior existing systems without the need for entire replacements of the converter hardware.

Modifications are possible in the described embodiments, and other embodiments are possible, within the scope of the claims.

What is claimed is:

1. A method of controlling a power converter, the method comprising:
executing a plurality of cycles, each cycle including:
turning on a first switch during a first period, the first switch having a first current handling terminal coupled to a first terminal of a power supply and a second current handling terminal coupled to a switch node; a terminal of a first inductor being coupled to the switch node, the first inductor having another terminal coupled to an output terminal for supplying current to a load;
turning on a second switch during a second period, the second period occurring after the first period such that the first switch and second switch are not on simultaneously, the second switch having a first current handling terminal coupled to the switch node and a second current handling terminal coupled to a second terminal of the power supply;
turning on a third switch at a first time during the second period, and turning the third switch off at a second time after the second period but before a beginning of the first period of a succeeding cycle, the third switch being turned off by a first open signal including a high discharge signal during a first open period followed by a lower discharge signal during a second open period, the third switch having a first current handling terminal coupled to the first terminal of the power supply and a second current handling terminal coupled to an auxiliary node and to a first terminal of a second inductor, a second terminal of the second inductor being coupled to the switch node; and
turning on a fourth switch at a third time after the second time, and turning the fourth switch off during the first period of the succeeding cycle, the fourth switch having a first current handling terminal coupled to the auxiliary node and a second current handling terminal coupled to the second terminal of the power supply.

2. The method of claim 1 in which the higher discharge signal is provided by a first transistor, and the lower discharge signal is provided by a second transistor that is smaller than the first transistor.

3. The method of claim 2 in which both the first and second transistors are on during the first open period, and the second transistor is on during the second open period.

4. The method of claim 2 in which a width of the first transistor is a multiple of a width of the second transistor.

5. An apparatus, comprising:
a first switch having a control terminal, a first current handling terminal coupled to a voltage source, and a second current handling terminal coupled to a switch node;
a second switch having a control terminal, a first current handling terminal coupled to the switch node, and a second current handling terminal coupled to a voltage reference;
a first inductor having a first terminal coupled to the switch node, and a second terminal coupled to an output terminal for supplying current to a load;
a third switch having a control terminal, a first current handling terminal coupled to the voltage source, and a second current handling terminal coupled to an auxiliary node;
a fourth switch having a control terminal, a first current handling terminal coupled to the auxiliary node, and a second current handling terminal coupled to the voltage reference;
a second inductor having a first terminal coupled to the switch node, and a second terminal coupled to the auxiliary node;
a first transistor coupled to the control terminal of the third switch to provide a high discharge control signal, and a second transistor coupled to the control terminal of the third switch to provide a low discharge control signal; and
timing circuitry configured to: output the control signals to the first, second, third and fourth switches; control the first transistor and the second transistor; couple a first closed signal to the control terminal of the third switch before coupling a first open signal to the control terminal of the second switch; couple a second open signal to the control terminal of the third switch a first selected time after the first open signal, the second open signal including the high discharge signal during a first period followed by the low discharge signal during a second period; couple a second closed signal to the control terminal of the fourth switch a second selected time after the second open signal; couple a third closed signal to the control terminal of the first switch a third selected time after the second closed signal; couple a third open signal to the control terminal of the fourth switch after the third closed signal; and couple a fourth open signal to the control terminal of the first switch after the third open signal.

6. The circuit of claim 5 in which the high discharge signal ends when a Miller plateau of the third switch begins.

7. The apparatus of claim 5 in which the second transistor has a width that is smaller than the width of the first transistor.

8. The apparatus of claim 5 in which both the first and second transistors are on during the first period, and the second transistor is on during the second period.

9. The apparatus of claim 5 in which a width of the first transistor is a multiple of a width of the second transistor.

10. The apparatus of claim 5 in which the first, third and fourth open signals include the higher discharge signal during a high discharge period followed by the lower discharge signal.

11. The circuit of claim 5 in which the first, second, third and fourth switches are field effect transistors.

12. The circuit of claim 5 in which the first period is shorter than the second period.

13. An integrated circuit comprising:
a first switch control output;
a second switch control output;
a third switch control output;
a fourth switch control output; and
timing circuitry configured to cause a first closed signal on the third switch control output before a first open signal on the second switch control output; to cause the third switch control output to provide a second open signal after a first selected time after the first open signal, the second open signal including a higher discharge signal during a first period followed by a lower discharge signal during a second period, to cause the fourth switch control output to provide a second closed signal a second selected time after the second open signal, to cause the first switch control output to provide a third closed signal a third selected time after the second closed signal, to cause the fourth switch control output to provide a third open signal a fourth selected time after the third closed signal, and a fourth open signal after the third open signal, and to cause the second switch control output to provide a fourth closed signal after the third open signal.

14. The integrated circuit of claim 13 in which the higher discharge signal ends when a Miller plateau of a switch coupled to the third switch control output begins.

15. The integrated circuit of claim 13 in which the higher discharge signal is provided by a first transistor, and the lower discharge signal is provided by a second transistor that is smaller than the first transistor.

16. The integrated circuit of claim 15 in which both the first and second transistors are on during the first period, and the second transistor is on during the second period.

17. The integrated circuit of claim 15 in which a width of the first transistor is a multiple of a width of the second transistor.

18. The integrated circuit of claim 13 in which the first, third and fourth open signals include the higher discharge signal during a high discharge period followed by the lower discharge signal.

19. The integrated circuit of claim 13 in which the first, second, third and fourth switch control outputs are configured to control a field effect transistor.

* * * * *